United States Patent [19]
Yanagisawa et al.

[11] Patent Number: 5,603,761
[45] Date of Patent: Feb. 18, 1997

[54] LIQUID PHASE EPITAXIAL GROWTH METHOD FOR CARRYING OUT THE SAME

[75] Inventors: Munehisa Yanagisawa, Takasaki; Susumu Higuchi, Annaka; Yuji Yoshida, Takasaki; Masahiko Saito, Annaka, all of Japan

[73] Assignee: Shin-Etsu Handotai Co., Ltd., Tokyo, Japan

[21] Appl. No.: 510,861

[22] Filed: Aug. 3, 1995

[30] Foreign Application Priority Data

Aug. 30, 1994 [JP] Japan .................................. 6-205300

[51] Int. Cl.$^6$ ............................................. C30B 19/06
[52] U.S. Cl. ........................... 117/54; 117/56; 117/57; 117/59; 117/61; 117/260; 118/719
[58] Field of Search ......................... 117/2, 54, 56, 117/57, 59, 61, 200, 201, 900, 934; 118/719; 427/248.1, 251

[56] References Cited

U.S. PATENT DOCUMENTS

| | | | |
|---|---|---|---|
| 3,996,891 | 12/1976 | Isawa et al. | 118/423 |
| 4,681,773 | 7/1987 | Bean | 427/38 |

FOREIGN PATENT DOCUMENTS

| | | | |
|---|---|---|---|
| 518332 | 12/1992 | France . | |
| 2508121 | 9/1975 | Germany | 117/59 |
| 0261004 | 9/1976 | Germany | 117/59 |
| 2558041 | 6/1977 | Germany | 117/2 |
| 505648 | 4/1971 | Switzerland . | |

OTHER PUBLICATIONS

Japanese Journal of Applied Physics, vol. 15, No. 7, Jul. 1976 pp. 1219–1227, Takao Yamaguchi et al. 'Rotating boat system for liquid phase epitaxial growth of GaP green light–emitting diodes' pp. 1219–1222.

Primary Examiner—R. Bruce Breneman
Assistant Examiner—Felisa Garrett
Attorney, Agent, or Firm—Nikaido, Marmelstein, Murray & Oram LLP

[57] ABSTRACT

In an improved liquid phase epitaxial growth method and apparatus in which a plurality of substrates are placed in a deposition chamber having at least one first vent hole; a solution for liquid phase growth is held in a solution chamber having at least one second vent hole and at least two sub-chambers separated by a partition plate and communicated with each other via a communicating portion; and before the substrates and the solution for liquid phase growth are brought into contact with each other, the deposition chamber and the solution chamber are revolved for causing the solution for liquid phase growth to move through the communicating portion so as to increase and decrease the volume of space portions of the respective sub-chambers and thereby replacement of a heat-treatment gas in the deposition chamber and the solution chamber is undertaken to achieve heat treatment. With this heat-treatment, surface oxide films on the substrates and the solution are removed, thus making it possible to obtain a liquid phase epitaxial layer with excellent qualities.

8 Claims, 6 Drawing Sheets

LIQUID PHASE EPITAXIAL GROWTH METHOD FOR CARRYING OUT THE SAME

BACKGROUND OF THE INVENTION

1. Field of the Invention

The present invention relates to a liquid phase epitaxial growth method and an apparatus used for carrying out the same.

2. Description of the Related Art

Liquid phase epitaxial growth method (hereinafter referred to as "liquid phase growth method") is a method of growing an epitaxial layer (growth layer) on a single crystal substrate in which the substrate is brought into contact with a saturated solution (or supersaturated solution) of a crystalline component (solute) in a solvent, and subsequently, those are cooled gradually to achieve growth of the epitaxial layer by precipitating the sotute in the solution onto the substrate. For instance, in a liquid phase growth method for GaP, a saturated Ga solution, wherein a GaP crystal (solute) is dissolved in a molton Ga (solvent), is placed by contact on a GaP substrate and then gradually cooled down to a predetermined temperature to achieve growth of a GaP layer by precipitating the GaP in the Ga solution onto the GaP substrate.

In order to obtain a liquid phase growth layer with a uniform layer thickness deposited on a number of substrates, a liquid phase growth apparatus of the closed rotary type (hereinafter referred to as "closed rotary boat") has been used heretofore. FIG. 7 of the accompanying drawings shows, in cross section, one such known closed rotary boat disclosed in Japanese Patent Laid-open Publication No. 57-85222. In FIG. 7, reference character 11 denotes a substrate container in which are disposed a plurality of substrate holders $12_1, 12_2, \ldots$ extending perpendicular to the bottom of the container 11. The substrate holders $12_1, 12_2, \ldots$ each have opposite surfaces to which a pair of substrate crystals $13_1, 13_2, \ldots$ is fixed, respectively. Designated by 14 is a Ga solution container for holding therein a Ga solution 15. Between the substrate container 11 and the Ga solution container 14 there is provided an elongated sliding plate 16 which separate these two containers 11 and 14. The sliding plate 16 is slidable in arrowed direction b shown in FIG. 7, and has a pair of parallel spaced longitudinal grooves $17_1$ and $17_2$ shown in FIG. 8. Thus, when the sliding plate 16 is slided and a portion with the grooves $17_1, 17_2$ is disposed within both containers 11, 14, the boat is half-revolved whereupon the Ga solution 15 is caused to move between both containers 11, 14 through the grooves $17_1, 17_2$. Conversely, when a portion without the grooves $17_1, 17_2$ of sliding plate 16 is located within both containers 11, 14, move communication between the substrate container 11 and the Ga solution container 14 is blocked by this grooveless portion of the sliding plate 16. Numeral 19 denotes an actuating rod to slide the sliding plate 16, and 18 an engagement hole formed in an end of the sliding plate 16 for receiving therein an end of the actuating rod 19.

Now, description will be given of a process in which the closed rotary boat of the foregoing construction is used to achieve liquid phase growth of a GaP layer.

A plurality of substrate crystals $13_1, 13_2, \ldots$ are set on the substrate holders $12_1, 12_2, \ldots$ received in the substrate container 11. On the other hand, a predetermined quantity of GaP and Ga are received in the Ga solution container 14. After internal spaces of the respective containers 11, 14 are replaced by an inert gas (Ar, for example), the containers 11, 14 are tightly closed or sealed and then set at a predetermined position within a reacting tube of an electric furnace. In this instance, the substrate container 11 is disposed above the Ga solution container 14.

The aforesaid closed condition is maintained until the boat is disassembled after completion of the liquid phase growth process, so that throughout the liquid phase growth process, the gas flowing within the reacting tube is prevented from flowing into and out from the closed boat (namely, the substrate container 11 and the Ga solution container 14).

Then, while the Ar gas is continuously flowing, the temperature is elevated to 1050° C. and subsequently maintained for more than 60 minutes to ensure that GaP is sufficiently dissolved in Ga, thereby a saturated Ga solution 15 at 1050° C. being produced. In this instance, the grooves $17_1, 17_2$ in the sliding plate 16 are disposed within the containers 11, 14.

Subsequently, the boat is half-revolved in the arrowed direction a, as shown in FIG. 7, so that the Ga solution 15 flows from the Ga solution container 14 through the grooves $17_1, 17_2$ into the substrate container 11 whereupon the Ga solution and the substrate crystals $13_1, 13_2, \ldots$ are brought into contact with each other. After they are closely contacted together, the sliding plate 16 is slid to move the portion without the grooves $17_1, 17_2$ into both containers 11, 14, thereby separating the substrate container 11 and the Ga solution container 14. Accordingly, the two containers 11 and 14 are each held in a closed or isolated condition, so that the Ga solution 15 once flown into the substrate container 11 cannot flow out even when the boat is revolved or oscillated during meltback or liquid phase growth (crystal growth) condition.

Thereafter, the temperature is elevated by 5°–10° C. for meltback. In the course of the temperature rises, the boat is half-revolved to make the meltback quantity uniform.

Following the foregoing temperature elevation, the boat is cooled down to 800° C. to precipitate GaP in the Ga solution 15 onto the substrate crystals $13_1, 13_2, \ldots$, thereby growing a GaP growth layer. During that time, in order to make the GaP growth layer uniform in thickness, the boat is half-revolved again when the temperature drops to about 975° C.

When the temperature falls to 800° C., the sliding plate 16 is slid to move the grooves $17_1, 17_2$ into the containers 11, 14, and then the boat is half-revolved for causing the Ga solution 15 to move from the substrate container 14 back to the Ga solution container 14 (to separate the Ga solution 15 from the substrate crystals $13_1, 13_2, \ldots$), thus completing the liquid phase growth process of the GaP layer.

In the liquid phase epitaxial growth process, an oxide film, if formed on the surface of each crystalline substrate or the surface of a solution for liquid phase growth, may cause negative crystal defects in a growth layer. Accordingly, in order to obtain a growth layer with little defects, a heat-treatment in a gaseous atmosphere containing $H_2$ must be performed to remove the oxide film from the solution surface and the substrate surface before the solution is brought into contact with the substrate.

However, the conventional closed rotary boat is so constructed as to prevent gas from flowing into and out from the deposition chamber (substrate container) and the solution chamber (solution container). With the liquid phase growth boat thus constructed, the substrates and the solution are brought into contact with each other while oxide films are still present on the substrates and the solution surface, and after the lapse of a predetermined time, meltback and/or liquid phase growth (crystal growth) is performed with the result that a number of surface defects is formed on and/or in a growth layer.

SUMMARY OF THE INVENTION

With the foregoing drawbacks of the prior art in view, it is an object of the present invention to provide a method and apparatus for the liquid phase growth, which is capable of obtaining a liquid phase growth layer with excellent qualities by heat-treating substrates and a solution surface with a heat-treatment gas, such as an $H_2$ gas or a gas including $H_2$, so as to remove surface oxide films before the substrates and the solution for the liquid phase growth are brought into contact with each other.

To attain the foregoing object, the present invention provides, in one aspect, a liquid phase epitaxial growth method, comprising the steps of: (a) placing a plurality of substrates in a deposition chamber having at least one first vent hole; (b) holding a solution for liquid phase epitaxial growth in a solution chamber having at least two sub-chambers separated by a partition plate and communicated with each other via a communicating portion, the solution chamber further having at least one second vent hole; and (c) before the substrates and the solution are brought into contact with each other, revolving the deposition chamber and the solution chamber, causing the solution to move through the communicating portion, increasing and decreasing the volume of space portions in the respective sub-chambers, and thereby undertaking replacement of a heat-treatment gas in the deposition chamber and the solution chamber to achieve heat treatment.

The first and second vent holes provided in the deposition chamber and the solution chamber, respectively, are permeable to gas and impermeable to liquid. The vent holes preferably have an opening area not greater than 0.5 mm². The lower limit of the opening areas is not specifically determined because the prescribed effect of the present invention can be attained so long as the vent hole is permeable to gas even when a smallest opening area is used. However, a vent hole having an opening area exceeding 0.5 mm² will allow the solution to flow out or leak from the vent hole in which instance a closing plate may be provided to open and close the vent hole. The heat-treatment gas is preferably an $H_2$ gas or a gas containing $H_2$. It is further preferable that the movement of the solution for liquid phase growth takes place two times and more.

In another aspect the present invention provides a liquid phase epitaxial growth apparatus, comprising: (a) a deposition chamber for placing a plurality of substrates therein and having at least one first vent hole; (b) a solution chamber, which is communicated with the deposition chamber, for holding a solution for liquid phase growth therein, having at least two sub-chambers separated by a partition plate and communicated with each other via a communicating portion, and further having at least one second vent hole; and (c) means for revolving the deposition chamber and the solution chamber to move them in a tilted position or an inverted position.

Preferably, the apparatus further includes a sliding plate movably disposed between the deposition chamber and the solution chamber and having an opening for selectively completing and separating communication between the deposition chamber and the solution chamber.

The deposition chamber, the solution chamber and the sliding plate are preferably made of a high-purity carbon material or the like material which is heat-resistant, chemically stable and non-corrosive to the growth solution.

In sum, the present invention relates to improvements in the conventional closed rotary type liquid phase growth technique and is characterized in that a vent hole means of a construction which is permeable to gas and impermeable to liquid is provided on each of a deposition chamber and a solution chamber to achieve replacement of a heat-treatment gas, such as an $H_2$ gas or a gas containing $H_2$ gas, with high efficiency for removing surface oxide films formed on substrates and a solution surface, thereby obtaining a liquid phase growth layer with excellent qualities.

The above and other objects, features and advantages of the present invention will become manifest to those versed in the art upon making reference to the detailed description and the accompanying sheets of drawings in which preferred embodiments incorporating the principles of the present invention are shown by way of illustrative example.

DETAILED DESCRIPTION OF THE INVENTION

Figure 1:
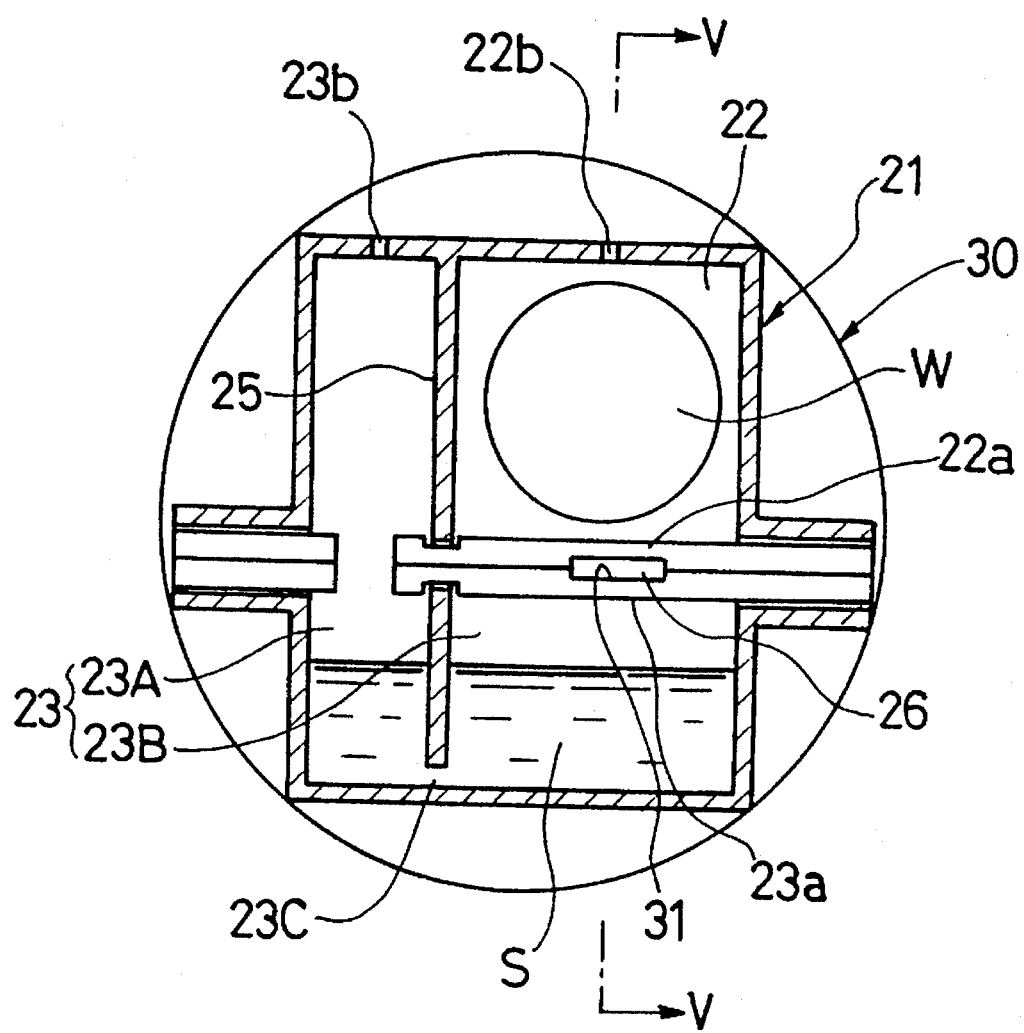
FIG. 1 is a diagrammatical cross-sectional view of a liquid phase epitaxial growth apparatus according to one embodiment of the present invention, the view showing the apparatus in a horizontal position.

Referring now to FIGS. 1 through 5, there is shown a rotary type liquid phase growth apparatus according to a first embodiment of the present invention.

The liquid phase growth apparatus, generally designated by 21, includes a deposition chamber 22 for placing therein a number of substrates W attached to a plurality of substrate holders 24, and a solution chamber 23 for holding therein a solution S for liquid phase growth. The deposition chamber 22 has at least one first vent hole 22b with an opening area not greater than 0.5 mm². The solution chamber 23 has at least one second vent hole 23b with an opening area not greater than 0.5 mm², and two sub-chambers 23A and 23B separated by a partition plate 25 and communicated with each other via a communicating portion 23C. The liquid phase growth apparatus 21 is set in a quartz furnace tube 30 such that they are non-rotatable relative to one another. The furnace tube 30 is rotated by a drive means for rotating (not shown) so that the liquid phase growth apparatus 21, i.e., the deposition chamber 22 and the solution chamber 23, are rotated synchronously in the arrowed direction Y shown in FIG. 5.

The deposition chamber 22 has a lower wall 22a with a lower opening 32 formed therein, while the solution chamber 23 has an upper wall 23a with an upper opening 33 formed therein in confrontation with the lower opening 32. The lower wall 22a and the upper wall 23a are disposed in vertical juxtaposition with a space 31 defined therebetween. A sliding plate 26 is slidably received in the space 31 and reciprocally movable in the arrowed direction X shown in FIG. 5. The sliding plate 26 has an elongated opening 34 formed at a position so that the opening 34 can be brought into register with the lower and upper openings 32, 33. When the opening 34 is in register with the lower and upper openings 32, 33, the deposition chamber 22 and the solution chamber 23 are held into fluid communication with each other. On the other hand, when the opening 34 is out of register with the lower and upper openings 32, 33, the deposition chamber 22 and the solution chamber 23 are held out of fluid communication with each other and each forms an isolated chamber. Designated by 27 is an actuating rod used for reciprocating the sliding plate 26.

Referring now to FIGS. 1–4, description will be given of a method of the present invention in which surfaces of the substrates W and solution S are heat-treated under flows of a gas ($H_2$ gas, for example) using the rotary liquid phase growth apparatus 21 of the foregoing construction.

(1) FIG. 1 illustrates the condition in which the rotary liquid phase growth apparatus 21 is disposed horizontally at a predetermined position (heated at a temperature T) in the furnace tube 30 under the flow of $H_2$ gas, with a plurality of substrates W and a solution S for liquid phase growth received in the deposition chamber 22 and the solution chamber 23, respectively. In this instance, the opening 34 in the sliding plate 26 is held in register with the openings 32 and 33 so that the deposition chamber 22 and the solution chamber 23 communicate with each other (open condition).

Figure 2:
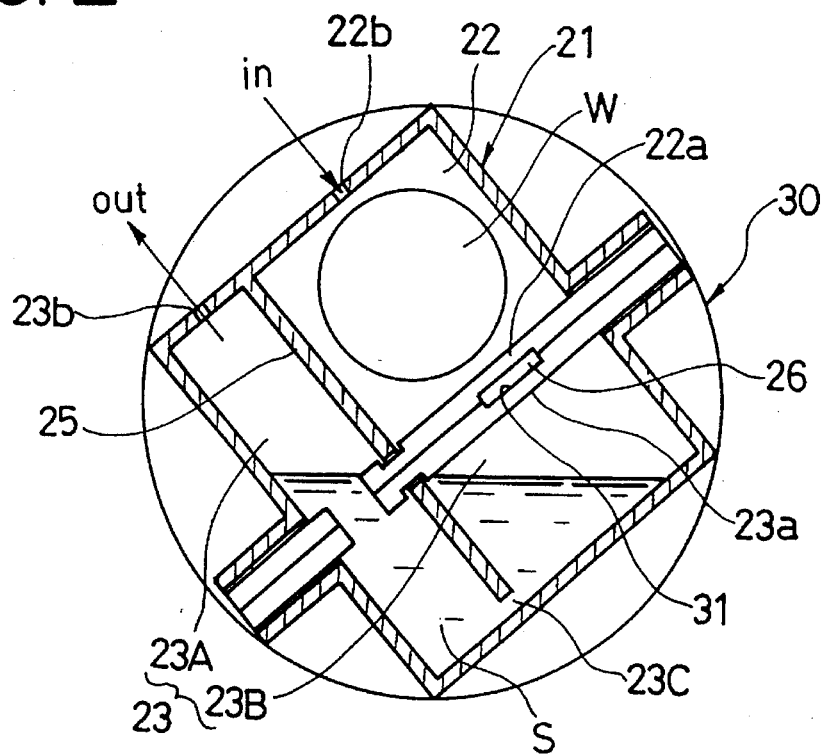
FIG. 2 is a view similar to FIG. 1, but showing the apparatus revolved (or tilted) in one direction from the position of FIG. 1.

(2) Then, the liquid phase growth apparatus 21 is revolved to a tilted position shown in FIG. 2 whereupon the volume of a space portion in the sub-chamber 23A of the solution chamber 23 decreases, whereas the volume of a space portion in the sub-chamber 23B of the solution chamber 23 (namely, the volume of a space portion in the deposition chamber 22 plus a space portion in the sub-chamber 23B) increases. As a consequence, the $H_2$ gas in the space portion of the sub-chamber 23A is forced out or discharged via the second vent hole 23b, while the $H_2$ gas flowing in the furnace tube 30 is drawn or introduced via the first vent hole 22b into the space portion in the deposition chamber 22 (and the space portion in the sub-chamber 23B).

Figure 3:
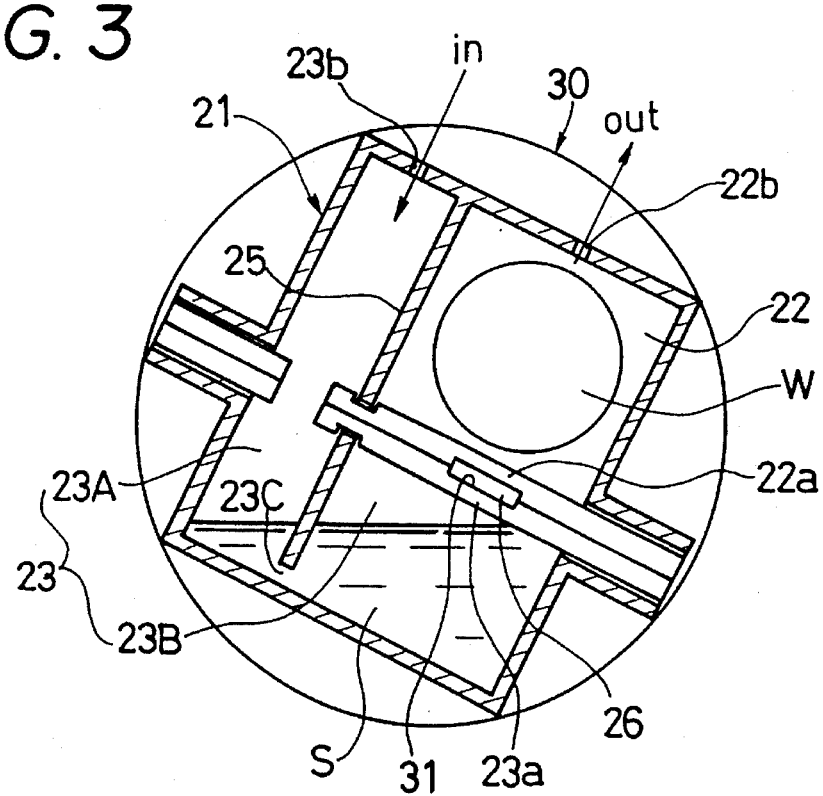
FIG. 3 is a view similar to FIG. 1, but showing the apparatus revolved (or tilted) in the opposite direction from the position of FIG. 2.

(3) Thereafter, the liquid phase growth apparatus 21 is revolved to a tilted position shown in FIG. 3 whereupon the $H_2$ gas flowing in the furnace tube 30 is drawn or introduced via the second vent hole 23b into the space portion in the sub-chamber 23A and, at the same time, the $H_2$ gas in the space portion of the deposition chamber (and the space portion in the sub-chamber 23B) is forced out or discharged via the first vent hole 22b.

The operations described at the preceding paragraphs (2) and (3) are repeated two times and more to undertake intake and discharge of the $H_2$ gas, so that the substrates W and the solution for liquid phase growth S are heat-treated at the temperature T under the flow of the $H_2$ gas, thereby removing oxide films or the like formed on the surface of the substrates W and the surface of the solution S.

Figure 4:
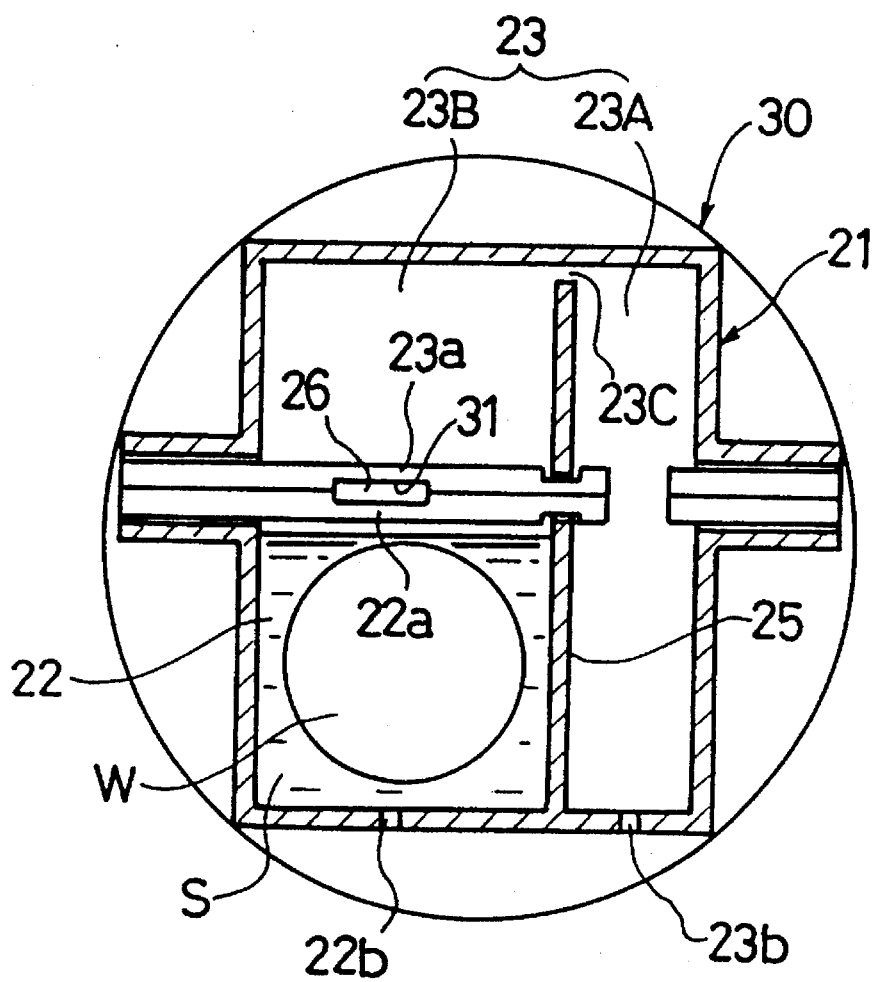
FIG. 4 is a view similar to FIG. 1, but showing the apparatus half-revolved from the position of FIG. 1.
Figure 5:
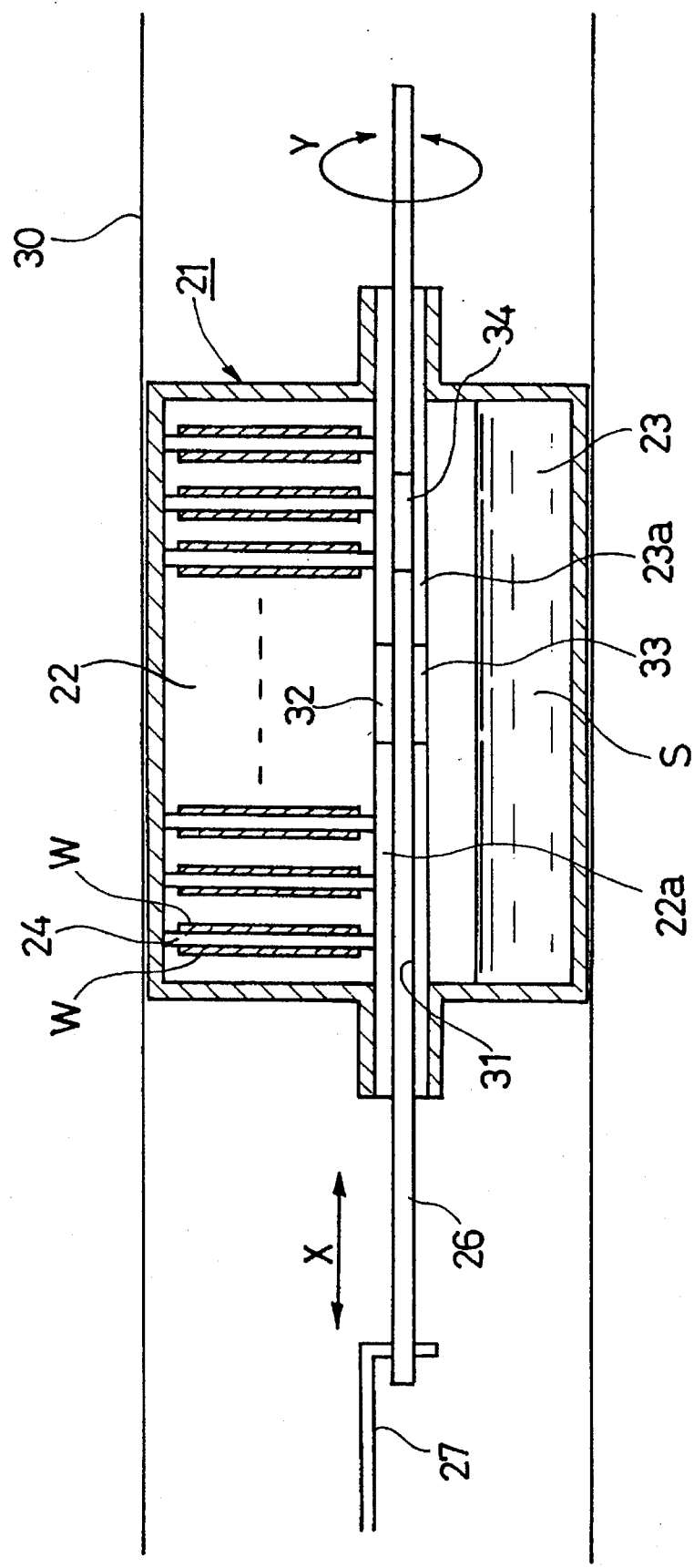
FIG. 5 is a cross-sectional view taken along line V—V of FIG. 1.

(4) Then, the liquid phase growth apparatus 21 is revolved to the position (the position half-revolved from the position of FIG. 1) shown in FIG. 4 whereupon the solution for liquid phase growth S in the solution chamber 23 flows into the deposition chamber 22 and is brought into contact with the substrates W. In this instance, the solution for liquid phase growth S cannot leak from the deposition chamber 22 through the first vent hole 22b so long as the opening area of the first vent hole 22b is not greater than 0.5 mm$^2$. Subsequently, the sliding plate 26 is slid to move the opening 34 of the sliding plate 26 in a position out of register with the openings 32 and 33, thus isolating the deposition chamber 22. Thereafter, meltback and/or crystal growth is achieved while the liquid phase growth apparatus 21 is rotating. In the case where the solution for liquid phase growth S leaks from the first vent hole 22b due, for example, to the first vent hole 22b having an opening area exceeding 0.5 mm$^2$, a closing plate (not shown) for opening and closing the first vent hole 22b may be provided.

Figure 6:
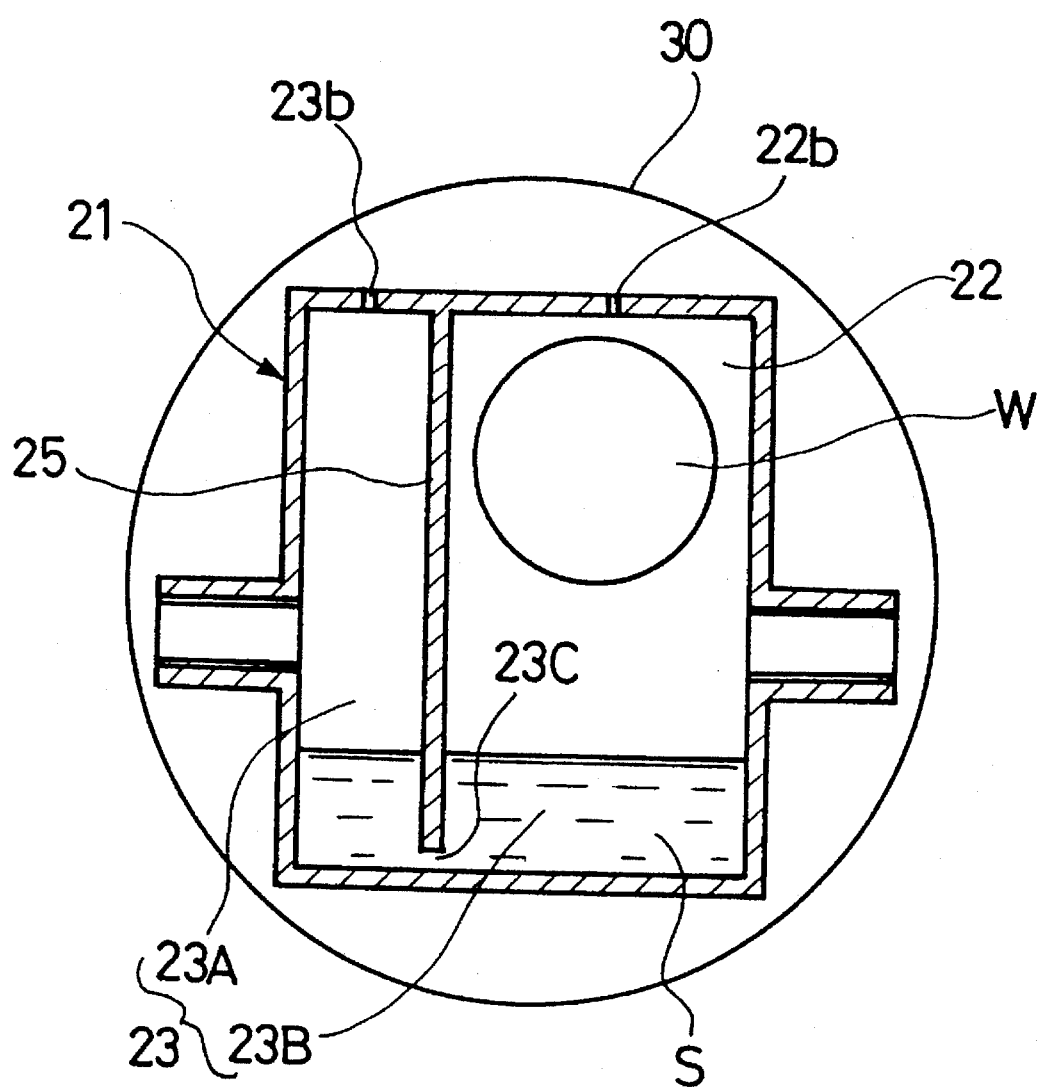
FIG. 6 is a diagrammatical cross-sectional view of a liquid phase epitaxial growth apparatus according to another embodiment of the present invention.

FIG. 6 shows another structural embodiment of the liquid phase growth apparatus according to the present invention. The liquid phase growth apparatus 21 of this embodiment has the same construction as the apparatus of the first embodiment shown in FIGS. 1–5 with the exception that there is no partition between a deposition chamber 22 and a sub-chamber 23B of a solution chamber 23. The thus constructed liquid phase growth apparatus 21 is able to carry out the method of this invention in the same operation as shown in FIGS. 1–4. In FIG. 6, these parts which are like or corresponding to those shown in FIGS. 1–5 are designated by the corresponding reference characters.

The present invention will be further described below by way of the following example in which the method and apparatus of this invention are used to achieve liquid phase growth.

EXAMPLE 1

Using the rotary liquid phase growth apparatus 21 (made of a carbon material) of the present invention shown in FIG. 1, an n-type GaP layer was grown on each of n-type GaP substrates W by means of the luquid phase growth method.

Substrate holders 24 and the n-type GaP substrates W firmly secured thereto (20 sheets per lot) were set in the deposition chamber 22, and the solution chamber 23 was supplied with predetermined quantities of Ga, GaP polly-crystal, and Te (tellurium) as an n-type dopant. The deposition chamber 22 and the solution chamber 23 were united with each other and then they were set in a predetermined position within a quartz furnace tube 30 of an electric furnace. At that time, the liquid phase growth apparatus 21 was held in the condition shown in FIG. 1 (namely, the communication between the deposition chamber 22 and the sub-chamber 23B of the solution chamber 23 were held in an open condition).

Then, the liquid phase growth apparatus 21 was heated to 1,000° C. while an $H_2$ gas was continuously flowing in the furnace tube 30. Subsequently, the temperature was maintained at the same temperature for 60 minutes to prepare a saturated Ga solution of GaP (hereinafter referred to as "Ga solution") which a sufficient quantity of GaP was dissolved in a moten Ga. During that time, the liquid phase growth apparatus 21 was oscillated at a frequency of 15 cycles per minute, as shown in FIGS. 1 and 3, so that the substrates W and the Ga solution S were heat-treated while the $H_2$ was caused to flow in the deposition chamber 22 and the solution chamber 23.

Subsequently, the liquid phase growth apparatus 21 was revolved to be the position of FIG. 4, thus causing the Ga solution S to flow from the solution chamber 23 into the deposition chamber 22 where the Ga solution S and the n-type GaP substrates W were brought into contact with each other. Then, the Ga solution S and the n-type GaP substrates W were held in mutual contact with each other for 5 minutes.

The sliding plate 26 was slid to place the deposition chamber 22 and the sub-chamber 23B in a closed or isolated condition, and after that heating was effected to raise the temperature to 1,010° C. at the rate of 1° C. per minute to achieve meltback. Subsequently, the temperature was lowered to 800° C. at the rate of 1° C. per minute, whereby an n-type GaP layer doped with Te at a predetermined concentration was grown on each of the n-type GaP substrates W. During the meltback and liquid phase growth processes, the liquid phase growth apparatus 21 was revolved (oscillated) at a predetermined frequency in order to obtain a uniform meltback quantity and a uniform growth thickness.

When the temperature dropped to 800° C., the sliding plate 26 was slid to place the deposition chamber 22 and the sub-chamber 23B in an open or communicating condition, and then the liquid phase growth apparatus 21 was half-revolved to return the Ga solution S to the solution chamber 23, thereby separating the Ga solution S from the substrates W so as to complete the liquid phase growth process.

Figure 7:
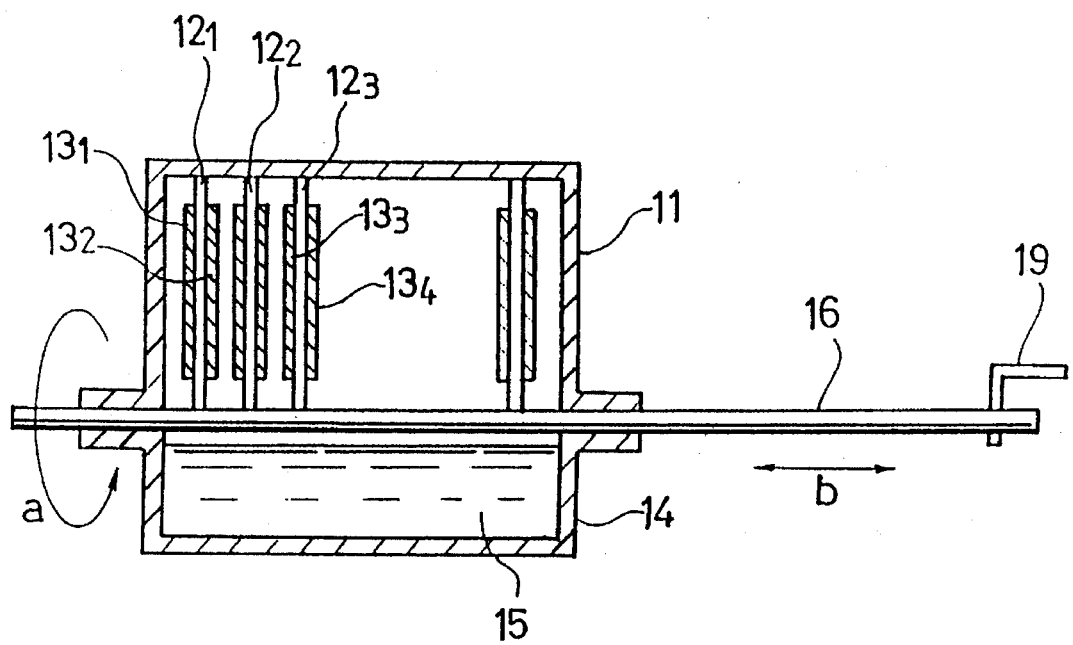
FIG. 7 is a diagrammatical longitudinal cross-sectional view of a conventional closed rotary boat.
Figure 8:
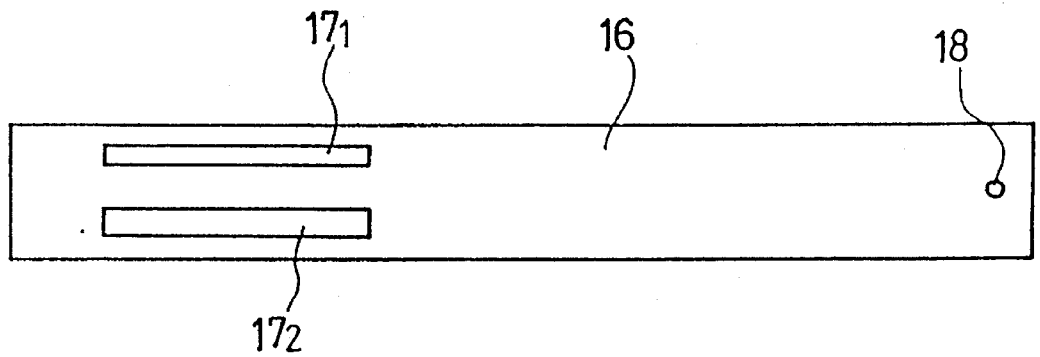
FIG. 8 is a plan view of a sliding plate of the closed rotary boat shown in FIG. 7.

The number of surface defects of the n-type GaP layers thus obtained were measured by an optical microscope and the results are shown in Table 1 below. Table 1 also contains the data regarding a Comparative Example achieved by using the conventional closed rotary growth apparatus shown in FIG. 7 so as to obtain an n-type GaP growth layer in the same manner as the Example 1. In Table 1, the number of surface defects (pieces per sheet) is the average of 100 sheets (20 sheets/lot×5 lots). As is apparent from Table 1, the number of surface defects is 15 pieces/sheet in the prior art and 0 (zero) in the present invention. It can therefore be understood that the present invention is particularly effective in reducing the surface defects of a liquid phase growth layer.

TABLE 1

|  | Number of Samples (sheets) | Number of Surface Defects (pieces/sheet) |
| --- | --- | --- |
| Example 1 (Invention) | 100 | 0 |
| Comparative Example (Prior Art) | 100 | 15.2 |

As described above, according to the present invention, before substrates and a solution for liquid phase growth are brought into contact with each other, the substrates and the surface of the solution are heat-treated with a heat-treatment gas, such as an $H_2$ gas or a gas containing $H_2$, to remove surface oxide layers, thus making it possible to obtain a liquid phase growth layer with excellent qualities.

Obviously, various minor changes and modifications of the present invention are possible in the light of the above teaching. It is therefore to be understood that within the scope of appended claims the invention may be practiced otherwise than as specifically described.

What is claimed is:

1. A liquid phase epitaxial growth method, comprising the steps of:
    (a) placing a plurality of substrates in a deposition chamber having at least one first vent hole;
    (b) holding a solution for liquid phase epitaxial growth in a solution chamber having at least two sub-chambers separated by a partition plate and communicated with each other via communicating portion, said solution chamber further having at least one second vent hole; and
    (c) before said substrates and said solution are brought into contact with each other, revolving said deposition chamber and said solution chamber for causing said solution to move through said communicating portion so as to increase and decrease the volume of space portions in said respective sub-chambers, and thereby introducing and forcing out a heat-treatment gas via first and second vent holes in said deposition chamber and said solution chamber to achieve heat treatment.

2. A liquid phase epitaxial growth method according to claim 1, wherein said first and second vent holes provided in said deposition chamber and said solution chamber, respectively, are permeable to gas and impermeable to liquid.

3. A liquid phase epitaxial growth method according to claim 2, wherein said heat-treatment gas comprises an $H_2$ gas or a gas containing $H_2$.

4. A liquid phase epitaxial growth method according to claim 3, wherein the solution for liquid phase growth passes through said communicating portion at least two times.

5. A liquid phase epitaxial growth method according to claim 2, wherein the solution for liquid phase growth passes through said communicating portion at least two times.

6. A liquid phase epitaxial growth method according to claim 1, wherein said heat-treatment gas comprises an $H_2$ gas or a gas containing $H_2$.

7. A liquid phase epitaxial growth method according to claim 6, wherein the solution for liquid phase growth passes through said communicating portion at least two times.

8. A liquid phase epitaxial growth method according to claim 1, wherein the solution for liquid phase growth passes through said communicating portion at least two times.

* * * * *